US012658259B2

(12) United States Patent
Lee

(10) Patent No.: US 12,658,259 B2
(45) Date of Patent: Jun. 16, 2026

(54) ADDRESS COUNTER USING ASYNCHRONOUS INPUT AND OPERATING METHOD THEREOF

(71) Applicant: SK hynix Inc., Icheon-si (KR)

(72) Inventor: Su Han Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 162 days.

(21) Appl. No.: 18/540,478

(22) Filed: Dec. 14, 2023

(65) Prior Publication Data

US 2025/0006263 A1    Jan. 2, 2025

(30) Foreign Application Priority Data

Jun. 28, 2023    (KR) ......................... 10-2023-0083422

(51) Int. Cl.
*G11C 16/08*      (2006.01)
*G11C 16/04*      (2006.01)
(52) U.S. Cl.
CPC .......... *G11C 16/08* (2013.01); *G11C 16/0483* (2013.01)

(58) Field of Classification Search
CPC . G11C 11/4076; G11C 11/4096; G11C 16/08; G11C 16/0483
USPC ......................................... 365/233.1, 185.18
See application file for complete search history.

(56) References Cited

U.S. PATENT DOCUMENTS

| | | | | | |
|---|---|---|---|---|---|
| 5,410,194 | A | * | 4/1995 | Freidin .............. | H03K 19/1774 |
| | | | | | 326/46 |
| 6,157,209 | A | * | 12/2000 | McGettigan ........... | H03K 23/56 |
| | | | | | 326/38 |

FOREIGN PATENT DOCUMENTS

| | | |
|---|---|---|
| KR | 1020120103398 A | 9/2012 |
| KR | 1020200051382 A | 5/2020 |

* cited by examiner

*Primary Examiner* — Alexander Sofocleous
*Assistant Examiner* — Duy H Long
(74) *Attorney, Agent, or Firm* — WILLIAM PARK AND ASSOCIATES LTD.

(57) ABSTRACT

An address counter comprises a flip-flop for performing a load operation of loading a start column address signal, responsive to a first logic signal provided to the flip-flop SET terminal and a second logic signal provided to a RESET terminal and for performing a counting operation of sequentially increasing a data value of the start column address signal.

14 Claims, 6 Drawing Sheets

ADDRESS COUNTER USING ASYNCHRONOUS INPUT AND OPERATING METHOD THEREOF

CROSS-REFERENCE TO RELATED APPLICATION

The present application claims priority under 35 U.S.C. § 119(a) to Korean patent application number 10-2023-0083422 filed on Jun. 28, 2023, in the Korean Intellectual Property Office, the entire disclosure of which is incorporated by reference herein.

BACKGROUND

1. Technical Field

The present disclosure generally relates to an electronic device, and more particularly, to an address counter and an operating method thereof.

2. Related Art

A storage device stores data under the control of a host device. A storage device may include a memory device which stores data and a storage controller which controls the memory device. The memory device may be classified into either a volatile memory device or a non-volatile memory device.

A non-volatile memory device may decode an address through a row decoder and a column decoder and transfer the decoded address to a memory cell array.

SUMMARY

Embodiments provide an address counter using an asynchronous input.

In accordance with an aspect of the present disclosure, there is provided an address counter including a flip-flop configured to perform a load operation of loading a start column address signal responsive to: a first logic signal received at a set input of the flip-flop and a second logic signal received at a reset set input of the flip-flop and perform a counting operation of sequentially increasing a data value of the start column address signal.

In accordance with another aspect of the present disclosure, there is provided a method of operating an address counter including a flip-flop, the method including: generating a first logic signal and a second logic signal; applying the first logic signal to a set terminal of the flip-flop; applying the second logic signal to a reset terminal of the flip-flop; and loading a start column address signal when at least one of the first logic signal and the second logic signal has a first logic level.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 4 is a circuit diagram illustrating in detail a four-bit address counter implemented using the counter shown in FIG. 2 in accordance with an embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Figure 1:
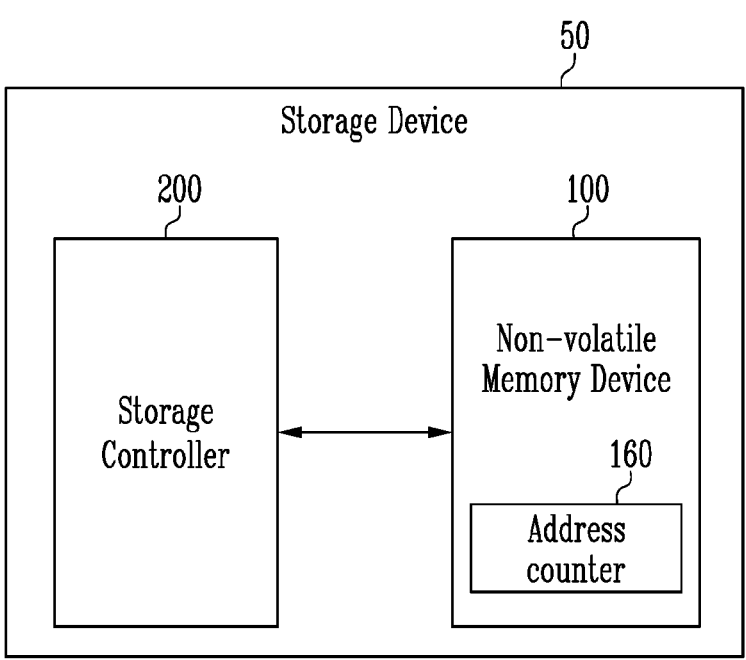
FIG. 1 is a block diagram illustrating a storage device in accordance with an embodiment of the present disclosure.

FIG. 1 is a block diagram illustrating a storage device in accordance with an embodiment of the present disclosure.

The storage device 50 may include a non-volatile memory device 100 and a storage controller 200.

The non-volatile memory device 100 may store data under the control of the storage controller 200. The non-volatile memory device 100 may include an address counter 160. The address counter 160 may generate a column address according to a command received from the storage controller 200. The column address may be necessary for the storage controller 200 to store data in the non-volatile memory device 100 or to read data stored in the non-volatile memory device 100. The address counter 160 may use an asynchronous input. This will be described in detail later with reference to FIG. 2.

In some embodiments, the non-volatile memory device 100 may be a NAND flash memory, but the scope of the present disclosure is not limited thereto. The non-volatile memory device 100 may be one of various storage devices capable of retaining stored data even when power supply is interrupted, such as a Phase-change Random Access Memory (PRAM), a Magnetic Random Access Memory (MRAM), a Resistive Random Access Memory (RRAM), and a Ferroelectric Random Access Memory (FRAM).

The storage controller 200 may control an operation of the non-volatile memory device 100, based on a command received from a host. The storage controller 200 may store data in the non-volatile memory device 100 or read data stored in the non-volatile memory device 100 according to the command of the host.

Figure 2:
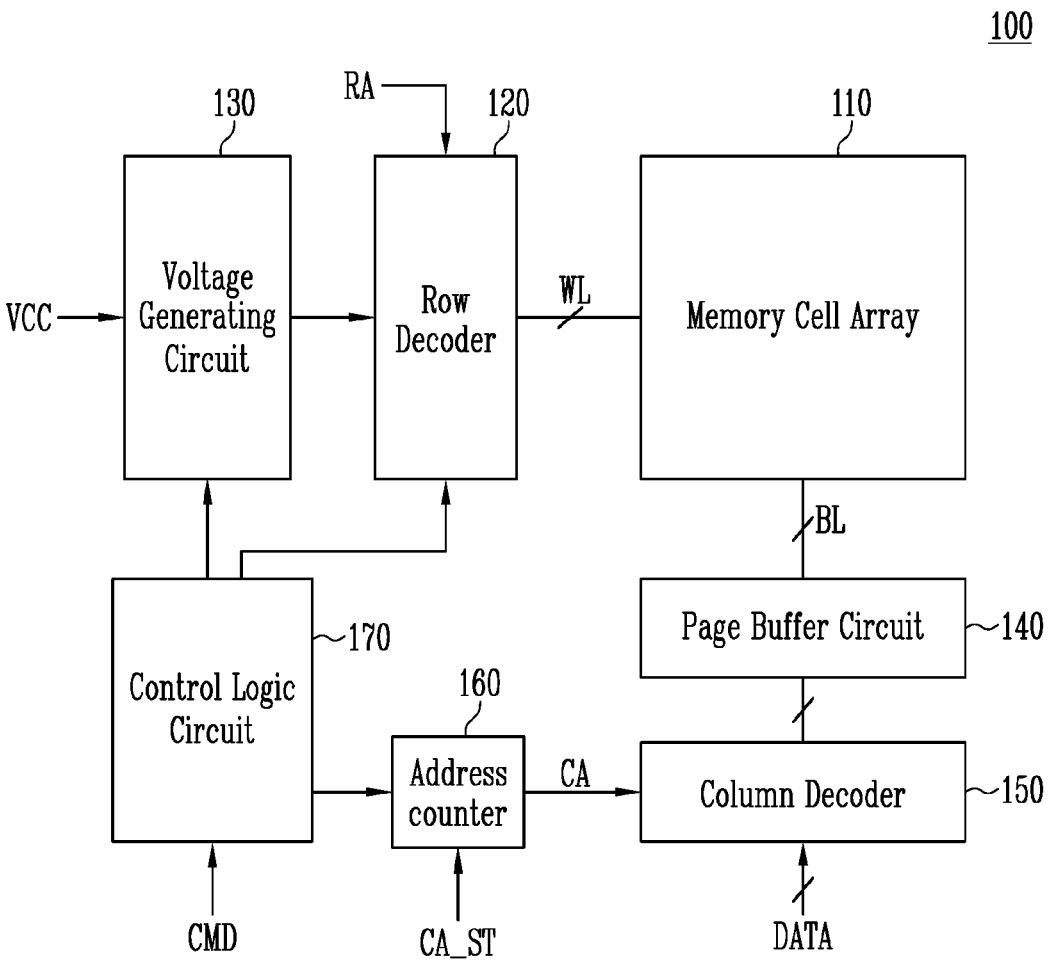
FIG. 2 is a block diagram illustrating in detail a non-volatile memory device shown in FIG. 1 in accordance with an embodiment of the present disclosure.

FIG. 2 is a block diagram illustrating in detail the non-volatile memory device shown in FIG. 1 in accordance with an embodiment of the present disclosure.

Referring to FIG. 2, the non-volatile memory device 100 may include a memory cell array 110, a row decoder 120, a voltage generating circuit 130, a page buffer circuit 140, a column decoder 150, an address counter 160, and a control logic circuit 170.

The memory cell array 110 may include a plurality of memory blocks. Each memory block may include a plurality of cell strings. Each cell string may be connected to the row decoder 120 through word lines WL and be connected to the page buffer circuit 140 through bit lines BL.

Each cell string may include a plurality of memory cells. Each memory cell of the plurality of memory cells may have a cell transistor connected in series between the bit lines BL and select lines. The plurality of cell transistors may be connected to drain select lines, word lines, and source select lines.

In some embodiments, the row decoder 120, the voltage generating circuit 130, the page buffer circuit 140, the column decoder 150, and the address counter 160 may be commonly designated as a peripheral circuit. The peripheral circuit may drive the memory cell array 110 under the control of the control logic circuit 170. The peripheral circuit may drive the memory cell array 110 to perform a program operation, a read operation, and an erase operation.

The row decoder 120 may be connected to the memory cell array through the word lines WL. The row decoder 120 may receive a row address signal RA, thereby activating a word line corresponding to the row address signal RA.

The voltage generating circuit 130 may generate various operating voltages for the non-volatile memory device 100 operation. For example, the voltage generating circuit 130 may generate a plurality of program voltages, a plurality of pass voltages, a plurality of verify voltages, a plurality of select read voltages, a plurality of unselect read voltages, a plurality of erase voltages, and a plurality of erase verify voltages, based on a power voltage VCC.

The page buffer circuit 140 may be connected to the memory cell array 110 through the bit lines BL. The page buffer circuit 140 may sense a voltage change of the bit lines BL, to read data stored in the memory cell array 110 and to temporarily store the read data. The page buffer circuit 140 may receive data from the column decoder 150 and controls the bit lines BL, based on the received data, to store data in the memory cell array 110.

The column decoder 150 may transfer data DATA received from an external device to the page buffer circuit 140 through a data line corresponding to a column address signal CA.

The address counter 160 may generate a column address signal CA by sequentially increasing a data value of a start column address signal CA_ST. The address counter 160 may transfer the column address signal CA to the column decoder 150.

In some embodiments, the address counter 160 may be connected to the column decoder 150 through a plurality of address lines. When the column address signal CA includes four bits, a least significant bit of the column address signal CA may be output to the column decoder 150 through a first address line, a first bit of the column address signal CA may be output to the column decoder 150 through a second address line, a second bit of the column address signal CA may be output to the column decoder 150 through a third address line, and a most significant bit of the column address signal CA may be output to the column decoder 150 through a fourth address line.

The start column address signal CA_ST may mean a column address signal at a point at which data starts being input. The address counter 160 may generate a column address signal CA allocated to continuously input data by sequentially increasing the received start column address signal CA_ST.

The address counter 160 may perform a load operation and a counting operation. The load operation may be an operation of loading the received start column address signal CA_ST to the address counter 160. The counting operation may be an operation of sequentially increasing values from a data value of a loaded start column address signal CA_ST until a column address signal CA having a desired data value is generated. That is, the start column address signal CA_ST loaded to the address counter 160 and the column address signal CA when the counting operation is started may have the same value.

The address counter 160 may perform the load operation, using an asynchronous input, and perform the counting operation, using a synchronous input. This will be described in detail later with reference to FIG. 3.

The control logic circuit 170 may control operation of the non-volatile memory device 100. For example, the control logic circuit 170 may control the row decoder 120, the voltage generation circuit 130, the page buffer circuit 140, the column decoder 150, and the address counter 160, responsive to a command CMD received from an external device, such as the storage controller 200.

Figure 3:
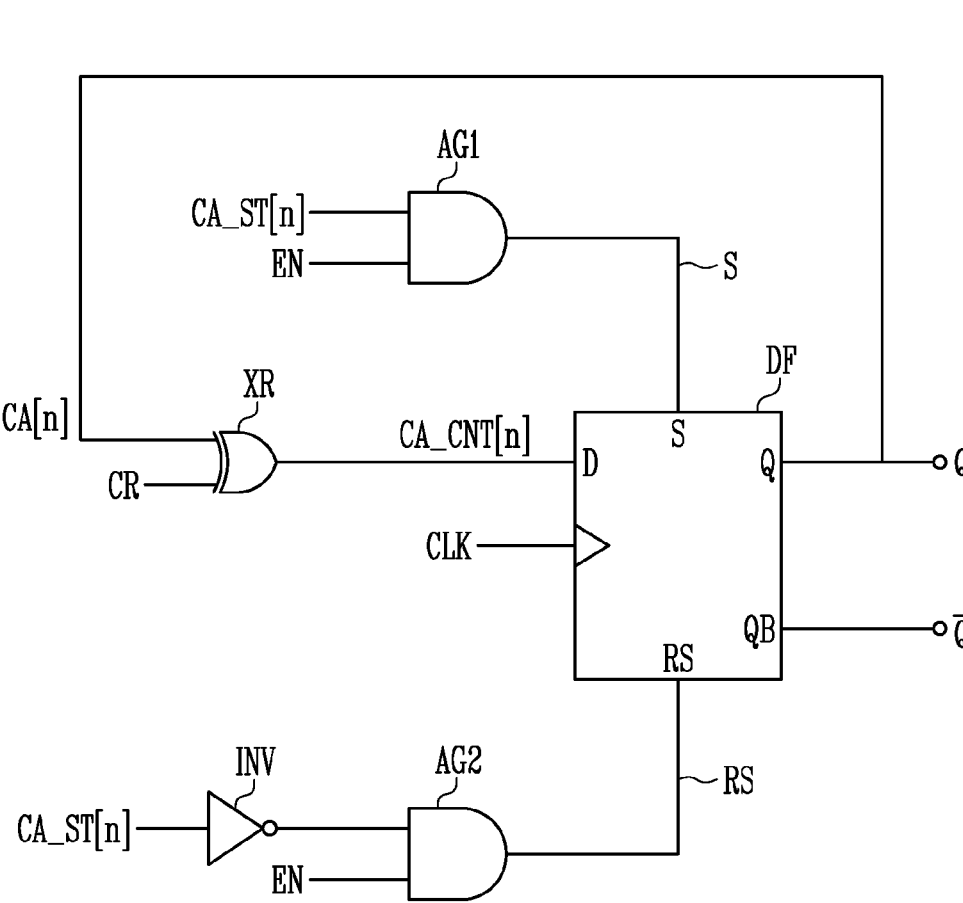
FIG. 3 is a circuit diagram illustrating in detail an address counter shown in FIG. 2 in accordance with an embodiment of the present disclosure.

FIG. 3 is a circuit diagram illustrating in detail the address counter shown in FIG. 2 in accordance with an embodiment of the present disclosure.

Referring to FIG. 3, an address counter 160 includes a first AND gate AG1, an inverter INV, a second AND gate AG2, an XOR gate XR, and a flip-flop DF. The address counter 160 may perform a load operation and a counting operation on one bit. The address counter 160 shown in FIG. 3 may include one bit counter. The bit counter may perform a load operation and a counting operation on one bit.

Hereinafter, for convenience of description, an nth bit of a start column address signal CA_ST may be designated as a first bit signal CA_ST[n], and an nth bit of a column address signal CA may be designated as a second bit signal CA[n].

The first AND gate AG1 may generate a first logic signal S, which is output to the SET input S of D flip-flop DF, by performing an AND operation on the first bit signal CA_ST [n] and an enable signal EN. The enable signal EN may thus be a signal for performing a load operation. For example, when the enable signal EN is logic 1, the address counter 160 may perform a load operation by forcing the Q output of flip-flop DF to a logic 1. The enable signal EN may thus be considered a load enable signal.

The inverter INV may output an inverted logic level of the first bit signal CA_ST[n]. The second AND gate AG2 may thus generate a second logic signal RS, which is output to the RESET input RS of flip-flop DF, by performing an AND operation on the inverted signal CA_ST[n] and the enable signal EN. The enable signal EN may be received from the control logic circuit 170 shown in FIG. 2.

As the second AND gate AG2 generates the second logic signal RS by performing the AND operation on the inverted signal CA_ST[n] and the enable signal EN, at least one of the first logic signal S and the second logic signal RS may be logic 1, when the enable signal EN is logic 1. When the enable signal EN has a second logic level, i.e., logic zero, the first logic signal S and the second logic signal RS may have the second logic level of logic zero.

The XOR gate XR may output a third bit signal CA_CNT [n] by performing an XOR operation on the second bit signal CA[n] and a carry signal CR. The third bit signal CA_CNT[n] may be an nth bit of a count column address signal CA_CNT.

When the carry signal CR has the first logic level of logic 1, the XOR gate XR may output the third bit signal CA_CNT[n] obtained by inverting a logic level of the second bit signal CA[n]. For example, when the carry signal CR is logic 1 and a previous data value of the second bit signal CA[n] is logic 1, the XOR gate XR may output the third bit signal CA_CNT[n] of which a previous data value is logic zero. When the carry signal CR has the logic high level, i.e., logic 1, and the previous data value of the second bit signal CA[n] is logic zero, the XOR gate XR may output the third bit signal CA_CNT[n] of which the previous data value is logic 1. That is, when the carry signal CR has the logic high level, the XOR gate XR may output the count column address signal CA_CNT in which '1' increases in binary data of the column address signal CA.

When the carry signal CR has the second logic level or logic zero, the XOR gate XR may output the third bit signal CA_CNT[n] having the same logic level as the second bit signal CA[n].

The flip-flop DF may include a D terminal (also known as a D "input") receiving the third bit signal CA_CNT[n], a clock input (also known as a clock "input") receiving a clock signal CLK, an S (Set) terminal (also known as a SET "input") receiving the first logic signal or logic 1, an RS (Reset) terminal (also known as an RS "input") receiving the second logic signal or logic zero, a Q output terminal (also known as a Q "output") connected to the XOR gate XR, and a QB terminal (also known as a QB or Q' "output") in a floating state. The clock signal CLK may be received from the control logic circuit 170 shown in FIG. 2.

In a preferred embodiment, the flip-flop DF may be a D flip-flop. In alternate embodiments the flip-flop may be a J-K flip-flop having the "K" input fixed at a logic zero.

Hereinafter, an operation of the address counter 160 according to the first logic signal and the second logic signal will be described.

The address counter 160 may perform one of a load operation and a counting operation, based on the first logic signal and the second logic signal. When at least one of the first logic signal S and the second logic signal RS has the first logic level of logic 1, the address counter 160 may perform the load operation. When the first logic signal and the second logic signal has the second logic level of logic zero, the address counter 160 may perform the counting operation.

When at least one of the first logic signal S and the second logic signal RS has the first logic level of logic 1, the flip-flop DF may output the first logic signal S to the S terminal. The first logic signal S output at the Q terminal may be fed back to the XOR gate XR. In some embodiments, when the enable signal EN has the first logic level of logic 1, the first logic signal S may have the same data value as the first bit signal CA_ST[n]. When the enable signal EN has the first logic level of logic 1, the address counter 160 may load the first bit signal CA_ST[n] as the second bit signal CA[n].

When the first logic signal S and the second logic signal RS have the second logic level of logic zero, the flip-flop DF may output the third bit signal CA_CNT[n] input to the D terminal for each rising edge time of the clock signal CLK. The third bit signal CA_CNT[n] output at the Q terminal may be fed back to the XOR gate XR.

In some embodiments, when the carry signal CR has the first logic level of logic 1, and the first logic signal S and the second logic signal RS have the second logic level of logic zero, the address counter 160 may increase a data value of the second bit signal CA[n] by '1.'

In some embodiments, when the enable signal EN has the first logic level of logic 1, at least one of the first logic signal S and the second logic signal RS may have the first logic level of logic 1. When the enable signal EN has the second logic level of logic zero, the first logic signal S and the second logic signal RS may have the second logic level of logic zero. That is, when the enable signal EN has the first logic level of logic 1, the address counter 160 may perform the load operation. When the enable signal EN has the second logic level of logic zero, the address counter 160 may perform the counting operation. The first logic level may be a logic 1 or a high level. The second logic level may be a logic zero or logic low level.

As described above, the address counter 160 may load the first bit signal CA_ST[n] through the load operation, and generate a signal of which a data value sequentially increases from the first bit signal CA_ST[n] through the counting operation.

In the case of an ordinary address counter, the address counter outputs, to the flip-flop DF, a signal for performing one of the load operation and the counting operation through a multiplexer. Accordingly, when the address counter performs the counting operation, time delays of the multiplexer, the XOR gate XR, and the flip-flop DF may occur.

However, referring to FIG. 3, the address counter 10 may separate the load operation and the counting operation from each other through an asynchronous input and a synchronous input. When at least one of signals received from the S terminal and the RS terminal of the flip-flop DF has the first logic level, the address counter 160 may perform the load operation. When the signals received from the S terminal and the RS terminal have the second logic level, the address counter 160 may perform the counting operation. Accordingly, when the address counter 160 performs the counting operation, time delays of the XOR gate XR and the flip-flop DF may occur. Unlike the ordinary address counter, any time delay of the multiplexer does not occur, and hence the operation speed of the address counter 160 of the present disclosure can be increased.

Figure 4:
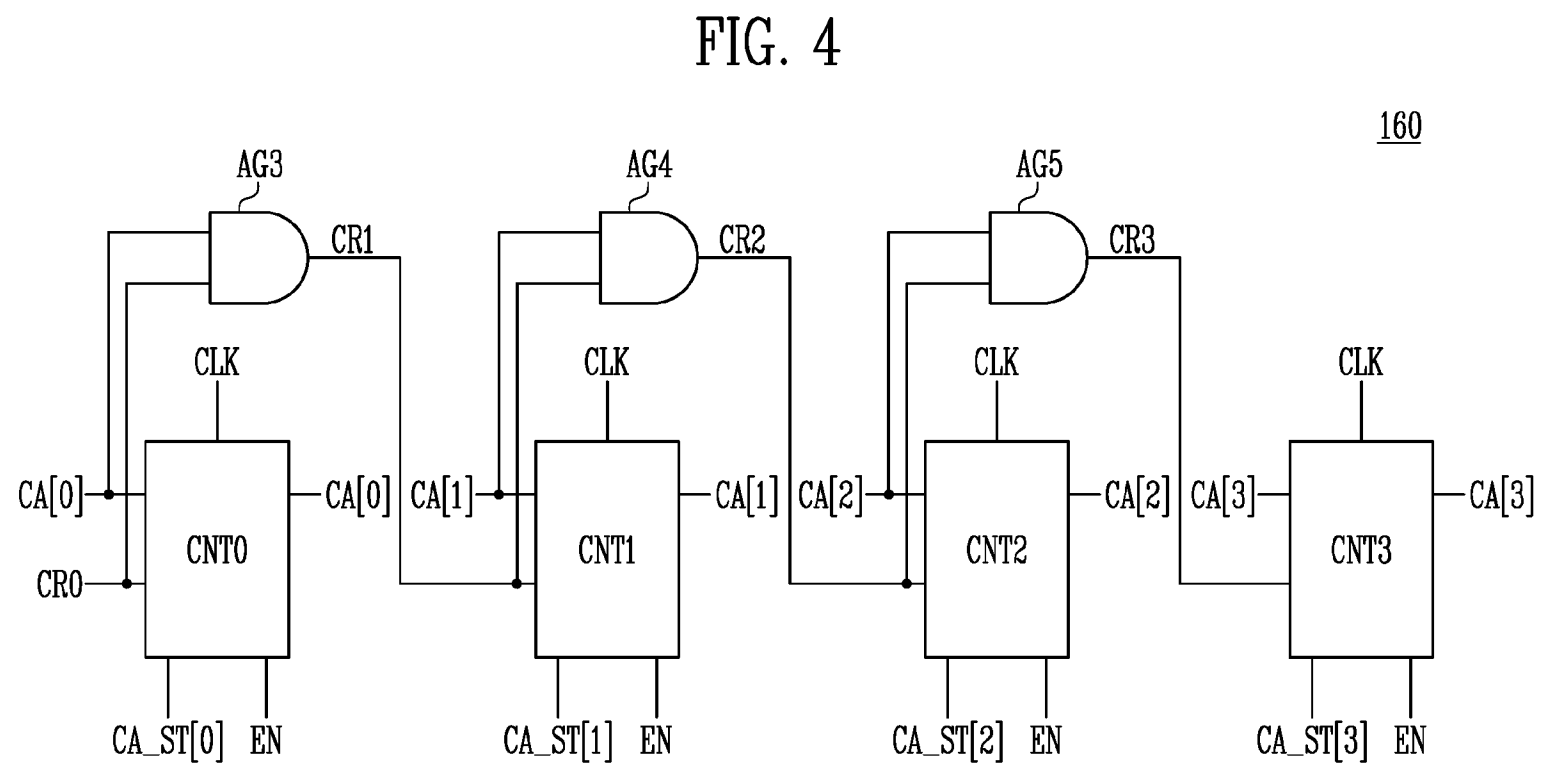

FIG. 4 is a circuit diagram illustrating in detail a four-bit address counter implemented using the address counter 160 shown in FIG. 2 in accordance with an embodiment of the present disclosure.

Referring to FIG. 4, an address counter 160 is illustrated, which includes zeroth to third bit counters CNT0 to CNT3, a third AND gate AG3, a fourth AND gate AG4, and a fifth AND gate AG5. The address counter 160 may perform a load operation and a counting operation on four bits. Each of the zeroth to third bit counters CNT0 to CNT3 may correspond to the address counter 160 shown in FIG. 3, because the zeroth to third bit counters CNT0 to CNT3 have the same topology as the address counter 160 shown in FIG. 3. Each of the zeroth to third bit counters CNT0 to CNT3 may include a first AND gate AG1, an inverter INV, a second AND gate AG2, an XOR gate XR, and a flip-flop DF.

Hereinafter, for convenience of description, it is illustrated that each of a start column address signal CA_ST[3:0] and a column address signal CA[3:0] is a signal having four bits.

The zeroth bit counter CNT0 may perform a load operation on a least significant bit CA_ST[0] of the start column address signal and a counting operation on a least significant bit CA[0] of the column address signal.

The zeroth bit counter CNT0 may generate its own first logic signal S and its own second logic signal RS, based on the least significant bit CA_ST[0] of the start column address signal and an enable signal EN. When at least one of the first logic signal S and the second logic signal RS has a first logic level or logic 1, the zeroth bit counter CNT0 may output the least significant bit CA_ST[0] of the start column address signal as the least significant bit CA[0] of the column address signal.

After that, when the first logic signal S and the second logic signal RS have a second logic level or logic zero, the zeroth bit counter CNT0 may generate a least significant bit of a count column address signal by performing an XOR operation on the least significant bit CA[0] of the column address signal and a carry signal CR0. In some embodiments, the carry signal CR0 received by the zeroth bit counter CNT0 may always have the first logic level. The zeroth bit counter CNT0 may output the least significant bit of the count column address signal as the least significant bit CA[0] of the column address signal in response to a rising edge of a clock signal CLK.

The third AND gate AG3 may generate a carry signal CR1 output to the first bit counter CNT1 by performing an AND operation on the least significant bit CA[0] of the column address signal and the carry signal CR0.

The first bit counter CNT1 may perform a load operation on a first bit CA_ST[1] of the start column address signal and a counting operation on a first bit CA[1] of the column address signal.

As with the zeroth bit counter CNT0, the first bit counter CNT1 may generate its own first logic signal S and its own second logic signal RS, based on the first bit CA_ST[1] of the start column address signal and the enable signal EN. When at least one of the first logic signal S and the second logic signal RS of the first bit counter CNT1 has the first logic level, the first bit counter CNT1 may output the first bit CA_ST[1] of the start column address signal as the first bit CA[1] of the column address signal.

After that, when the first logic signal S and the second logic signal RS have the second logic level, the first bit counter CNT1 may generate a first bit of the count column address signal by performing an XOR operation on the least significant bit CA[1] of the column address signal and the carry signal CR1. The first bit counter CNT1 may output the first bit of the count column address signal as the first bit CA[1] of the column address signal in response to a rising edge of the clock signal CLK.

The fourth AND gate AG4 may generate a carry signal CR2 output to the second bit counter CNT2 by performing an AND operation on the first bit CA[1] of the column address signal and the carry signal CR1.

The second bit counter CNT2 has the same topology as the zeroth bit counter CNT0 and the first bit counter CNT1. The second bit counter CNT2 may thus perform a load operation on a second bit CA_ST[2] of the start column address signal and a counting operation on a second bit CA[2] of the column address signal.

The second bit counter CNT2 may generate a first logic signal S and a second logic signal RS, based on the second bit CA_ST[2] of the start column address signal and the enable signal EN. When at least one of the first logic signal S and the second logic signal RS has the first logic level, the second bit counter CNT2 may output the second bit CA_ST[2] of the start column address signal as the second bit CA[2] of the column address signal.

After that, when the first logic signal S and the second logic signal RS have the second logic level, the second bit counter CNT2 may generate a second bit of the count column address signal by performing an XOR operation on the second bit CA[2] of the column address signal and the carry signal CR2. The second bit counter CNT2 may output the second bit of the count column address signal as the second bit CA[2] of the column address signal in response to a rising edge of the clock signal CLK.

The fifth AND gate AG5 may generate a carry signal CR3 output to the third bit counter CNT3 by performing an AND operation on the second bit CA[2] of the column address signal and the carry signal CR2.

The third bit counter CNT3, which also has the same topology as the other bit counters, may perform a load operation on a most significant bit CA_ST[3] of the start column address signal and a counting operation on a most significant bit CA[3] of the column address signal.

The third bit counter CNT3 may generate a first logic signal and a second logic signal, based on the most significant bit CA_ST[3] of the start column address signal and the enable signal EN. When at least one of the first logic signal and the second logic signal has the first logic level, the third bit counter CNT3 may output the most significant bit CA_ST[3] of the start column address signal as the most significant bit CA[3] of the column address signal.

After that, when the first logic signal and the second logic signal have the second logic level, the third bit counter CNT3 may generate a most significant bit of the count column address signal by performing an XOR operation on the most significant bit CA[3] of the column address signal and the carry signal CR3. The third bit counter CNT3 may output the most significant bit of the count column address signal as the most significant bit CA[3] of the column address signal in response to a rising edge of the clock signal CLK.

Figure 5:
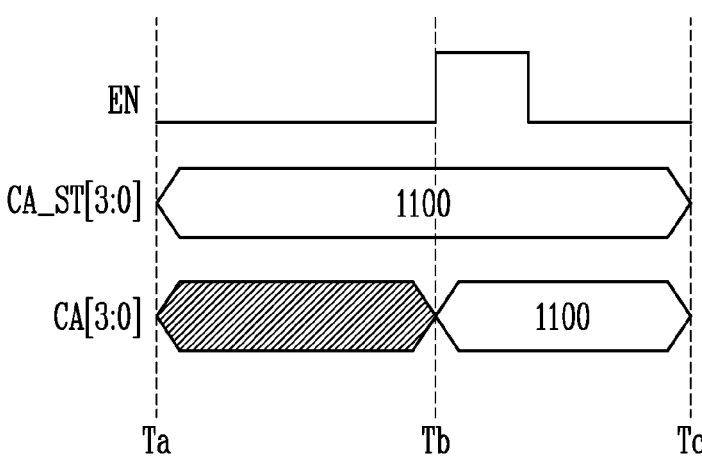
FIG. 5 is a timing diagram illustrating a load operation in accordance with an embodiment of the present disclosure.

FIG. 5 is a timing diagram illustrating a load operation in accordance with an embodiment of the present disclosure.

Referring to FIGS. 4 and 5, a load operation of the address counter 160, in which the start column address signal CA_ST[3:0] is loaded as the column address signal CA[3:0], is described. Hereinafter, for convenience of description, it is illustrated that each of the start column address signal CA_ST[3:0] and the column address signal CA[3:0] is a signal having four bits.

Between a time Ta and a time Tb, the enable signal EN may have a logic low level. The start column address signal CA_ST[3:0] may have a binary data value as '1100.' The column address signal CA[3:0] may have data in an unknown state. For example, the column address signal CA[3:0] may arbitrarily have one value in data capable of being expressed in four bits.

At the time Tb, the logic level of the enable signal EN may be changed from the logic low level to a logic high level. The address counter 160 may load the start column address signal CA_ST[3:0] as the column address signal CA[3:0], based on the enable signal EN having the logic high level. Accordingly, from the time Tb to a time Tc, the column address signal CA[3:0] may have a binary data value as '1100.'

In some embodiments, the output column address signal CA[3:0] may be fed back to the address counter 160. After that, the address counter 160 may perform a counting operation on the received column address signal CA[3:0] according to the logic level of the enable signal EN.

Figure 6:
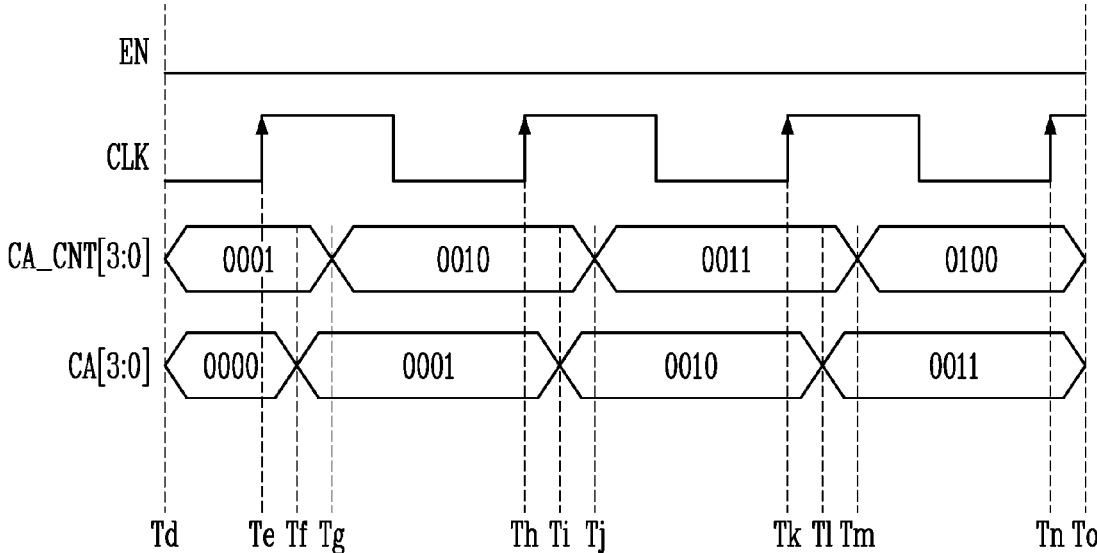
FIG. 6 is a timing diagram illustrating a counting operation in accordance with an embodiment of the present disclosure.

FIG. 6 is a timing diagram illustrating a counting operation in accordance with an embodiment of the present disclosure.

Referring to FIGS. 4 and 6, a counting operation of the address counter 160 on the column address signal CA[3:0] is described. Hereinafter, for convenience of description, it is illustrated that each of the start column address signal CA_ST[3:0] and the column address signal CA[3:0] is a signal having four bits, and it is illustrated that the carry signal CR0 received by the zeroth bit counter CNT0 always has a logic high level.

Between a time Td and a time To, the enable signal EN may have a logic low level. Between the time Td and the time To, the address counter 160 may perform a counting operation.

At a time Te, the address counter 160 may output a count column address signal CA_CNT[3:0] as the column address signal CA[3:0], based on a rising edge of the clock signal CLK. Due to a time delay of the flip-flop, the column address signal CA[3:0] may have the same binary data value (e.g., 0001) as the count column address signal CA_CNT [3:0] from a time Tf.

Between the time Tf and a time Ti, the address counter 160 may output the count column address signal CA_CNT [3:0] having a binary data value (e.g., 0010) obtained by increasing the binary data value (e.g., 0001) of the column address signal CA_CNT[3:0] by '1.' However, due to a time delay of the XOR gate, the count column address signal CA_CNT[3:0] may have binary data as '0001' between a time Tg and a time Tj.

At a time Th, the address counter 160 may output the count column address signal CA_CNT[3:0] as the column address signal CA[3:0], based on a rising edge of the clock signal CLK. Due to a time delay of the flip-flop, the column address signal CA[3:0] may have the same binary data value (e.g., 0010) as the count column address signal CA_CNT [3:0] from the time Ti.

Between the time Ti and a time Tl, the address counter 160 may output the count column address signal CA_CNT [3:0] having a binary data value (e.g., 0011) obtained by increasing the binary data value (e.g., 0010) of the column address signal CA[3:0] by '1.' However, due to a time delay of the XOR gate, the count column address signal CA_CNT [3:0] may have binary data as '0011' between the time Tj and a time Tm.

At a time Tk, the address counter 160 may output the count column address signal CA_CNT[3:0] as the column address signal CA[3:0], based on a rising edge of the clock signal CLK. Due to a time delay of the flip-flop, the column address signal CA[3:0] may have the same binary data value (e.g., 0011) as the count column address signal CA_CNT [3:0] from the time Tl.

Between the time Tl and the time To, the address counter 160 may output the count column address signal CA_CNT [3:0] having a binary data value (e.g., 0100) obtained by increasing the binary data value (e.g., 0011) of the column address signal CA[3:0] by '1.' However, due to a time delay of the XOR gate, the count column address signal CA_CNT [3:0] may have binary data as '0100' from the time Tm.

At a time Tn, the address counter 160 may output the count column address signal CA_CNT[3:0] as the column address signal CA[3:0], based on a rising edge of the clock signal CLK. Due to a time delay of the flip-flop, the column address signal CA[3:0] may have the same binary data value (e.g., 0100) as the count column address signal CA_CNT [3:0] from the time To.

As described above, when the address counter 160 performs the counting operation, time delays of the XOR gate XR and the flip-flop DF may occur. Unlike the ordinary address counter, any time delay of the multiplexer does not occur, and hence the operation speed of the address counter 160 of the present disclosure can be increased.

For convenience of description, the enable signal EN, the clock signal CLK, the count column address signal CA_CNT[3:0], and the column address signal CA[3:0] between the time Td and the time To have been disclosed. However, the present disclosure is not limited thereto, and the address counter 160 may perform a counting operation on the column address signal CA[3:0].

Figure 7:
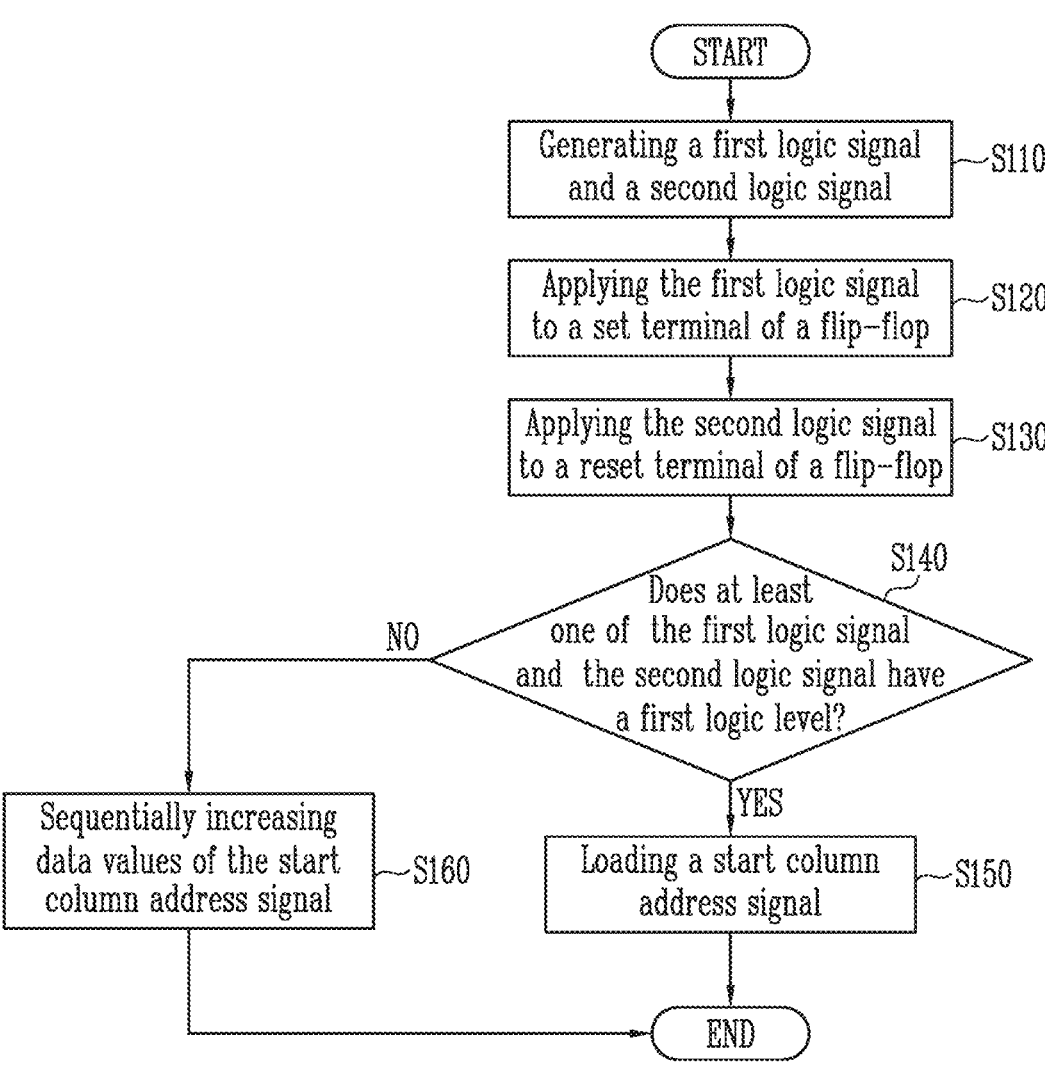
FIG. 7 is a flowchart illustrating an operating method of an address counter in accordance with an embodiment of the present disclosure.

FIG. 7 is a flowchart illustrating steps of an operating method for an address counter in accordance with an embodiment of the present disclosure.

Referring to FIG. 7, an operating method of the address counter 160 shown in FIG. 3 is described. The address counter 160 may of course include a D-type flip-flop, DF.

In step S110, the address counter 160 may generate a first logic signal and a second logic signal. In some embodiments, the address counter 160 may generate the first logic signal by performing a first logic operation on a start column address signal and an enable signal. The address counter 160 may generate an inverting signal obtained by inverting a logic level of the start column address signal. The address counter 160 may generate the second logic signal by performing the first logic operation on the inverting signal and the enable signal. The first logic operation may be an AND operation.

In step S120, the address counter 160 may apply the first logic signal to an S terminal of the flip-flop DF.

In step S130, the address counter 160 may apply the second logic signal to an RS terminal of the flip-flop DF. It is illustrated that the step 130 is performed after the step S120. However, the present disclosure is not limited thereto, the step S120 may be performed after the step S130 is performed, or the steps S120 and S130 may be simultaneously performed.

In step S140, the address counter 160 may check whether at least one of the first logic signal and the second logic signal has a first logic level. When at least one of the first logic signal and the second logic signal has the first logic level, the address counter 160 may perform step S150. When at least one of the first logic signal and the second logic signal does not have the first logic level, the address counter 160 may perform step S160.

In the step S150, the address counter 160 may load the start column address signal.

In the step S160, the address counter 160 may sequentially increase a data value of the start column address signal. The start column address signal may be a signal loaded by the address counter 160 according to whether the enable signal has the first logic level in a previous operation of the address counter 160. In some embodiments, the address counter 160 may generate a third logic signal by performing a second logic operation on a column address signal and a carry signal. The third logic signal may be a signal having a data value obtained by increasing a data value of the column address signal by '1.' The address counter 160 may feed back the third logic signal as the column address signal in response to a rising edge of a clock signal. The second logic operation may be an XOR operation.

In accordance with the present disclosure, there can be provided an address counter using an asynchronous input. The number of logic gates is decreased using the asynchronous input, so that time delays can be reduced, and the operation speed of a memory device can be increased.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, the steps of the method depicted in FIG. 7 are not necessarily performed in the exact sequence shown but may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

What is claimed is:

1. An address counter comprising:
a first logic gate configured to generate a first logic signal by performing a first logic operation on a start column address signal and an enable signal;
a second logic gate configured to generate a second logic signal by performing the first logic operation on an inverted start column address signal and the enable signal;
a flip-flop configured to:
receive the first logic signal through a set input of the flip-flop;
receive the second logic signal through a reset input of the flip-flop;
receive a third logic signal through a D input of the flip-flop; and
output a column address signal which is the first logic signal or the third logic signal, the column address signal is determined based on a logic level of the first logic signal and a logic level of the second logic signal; and
a third logic gate configured to generate the third logic signal by performing a second logic operation on the column address signal and a carry signal.

2. The address counter of claim 1, wherein the flip-flop is configured to:
perform a load operation by outputting the first logic signal as the column address signal when at least one of the logic level of the first logic signal and the logic level of the second logic signal is a logic high level; and
perform a counting operation of sequentially increasing a data value of the start column address signal by outputting the third logic signal as the column address signal when the logic level of the first logic signal and the logic level of the second logic signal are a second logic low level.

3. The address counter of claim 2,
wherein, when the logic level of the enable signal is the logic high level, at least one of the logic level of the first logic signal and the logic level of the second logic signal is the logic high level, and
wherein, when the logic level of the enable signal is the logic low level, both the logic level of the first logic signal and the logic level of the second logic signal are the logic low level.

4. The address counter of claim 3, further comprising:
an inverter configured to generate the inverted start column address signal by inverting the logic level of the start column address signal,
wherein the first logic operation is an AND operation, and
wherein the second logic operation is an XOR.

5. The address counter of claim 4, wherein, when the logic level of the enable signal is the logic low level, the flip-flop feeds back the column address signal to the third logic gate in response to a rising edge of a clock signal.

6. The address counter of claim 5, wherein, when the logic level of the carry signal is the logic low level, the third logic gate outputs the column address signal received from the flip-flop to the D input of the flip-flop as the third logic signal.

7. The address counter of claim 5, wherein, when the logic level of the carry signal is the logic high level, the third logic gate generates the third logic signal by increasing 1 in binary data of the column address signal received from the flip-flop and outputs the third logic signal to the D input of the flip-flop.

8. The address counter of claim 2, wherein the load operation is performed through an asynchronous input of the flip-flop, and the counting operation is performed through a synchronous input of the flip-flop.

9. A method of operating an address counter including a first logic gate generating a first logic signal, a second logic gate generating a second logic signal, a flip-flop outputting a column address signal and a third logic gate generating the third logic signal, the method comprising:
generating a first logic signal by performing a first logic operation on a start column address signal and an enable signal;
generating a second logic signal by performing the first logic operation on an inverted start column address signal and the enable signal;
generating the third logic signal by performing a second logic operation on the column address signal and a carry signal; and
determining one of the first logic signal and the third logic signal, as the column address signal, based on a logic level of the first logic signal and a logic level of the second logic signal; and
outputting the column address signal.

10. The method of claim 9,
wherein the first logic operation is an AND operation,
wherein at least one of the logic level of the first logic signal and the logic level of the second logic signal is a logic high level in response that the logic level of the enable signal is the logic high level,
wherein both the logic level of the first logic signal and the logic level of the second logic signal are a logic low level in response that the logic level of the enable signal is the logic low level.

11. The method of claim 10, wherein the determining the column address signal includes determining the first logic signal as the column address signal in response that at least one of the logic level of the first logic signal and the logic level of the second logic signal is the logic high level.

12. The method of claim 10, wherein the determining the column address signal includes determining the third logic signal as the column address signal in response that both the logic level of the first logic signal and the logic level of the second logic signal are a logic low level.

13. The method of claim 12,
wherein the second logic operation is an XOR operation,
wherein the outputting the column address signal includes feeding back the column address signal to the third logic gate in response to a rising edge of a clock signal.

14. The method of claim 13, wherein the generating the third logic signal includes:

generating the third logic signal by increasing 1 in binary data of the column address signal received from the flip-flop in response that the logic level of the carry signal is the logic high level; and outputting the third logic signal to the D input of the flip-flop.

\* \* \* \* \*